FIELD EFFECT DEVICE HAVING AN ELECTROLYTICALLY INSULATED GATE

Filed June 28, 1965

INVENTOR.
JOHN L. JANNING
BY Dybvig and Dybvig
HIS ATTORNEYS

United States Patent Office 3,445,732

Patented May 20, 1969

3,445,732

FIELD EFFECT DEVICE HAVING AN ELECTROLYTICALLY INSULATED GATE

John L. Janning, Dayton, Ohio, assignor to Ledex, Inc., Dayton, Ohio, a corporation of Ohio Filed June 28, 1965, Ser. No. 467,649

Int. Cl. H01l *11/14*

U.S. Cl. 317—234 3 Claims

ABSTRACT OF THE DISCLOSURE

A thin film field effect device having a gate element insulated by electrolytic action.

This invention relates to a thin film active device and, more particularly, to a plural electrode thin film device capable of modulating an electric signal applied thereto, however the invention is not necessarily so limited.

In recent years the electronics industry has directed considerable effort toward the development of integrated circuits, that is, circuits fabricated as a unitary body without soldering for lead connections etc. and which include the basic elements of an electrical circuit, namely, active devices and passive elements such as resistors and capacitors.

To date the research investigations fall broadly into two basic approaches. One approach involves the growth of semiconductor bodies and the doping of such bodies with impurities where desired to introduce into the semiconductor the operating characteristics required to produce the needed circuit elements. The end result is generally referred to as a monolithic circuit.

The second approach involves the superposition of thin films on selected areas of a supporting substrate, the superposed films supplying the needed capacitance elements and the active devices, with resistances being controlled by film thickness and composition.

Both of the foregoing approaches have desirable attributes. A principal attribute of the monolithic approach is the relative ease with which active devices are produced. Desirable attributes of the thin film approach are the economy of fabrication and the possibilities of more rigid quality control.

A major shortcoming to thin film circuitry at the present time is the absence of a suitable active device for use in thin film circuits. Basic designs for thin film active devices exist but technical difficulties in the fabrication of such devices have stymied the industry.

An object of the present invention is to provide an active device capable of fabrication with thin film techniques.

Another object of the present invention is to provide a new and improved method for the fabrication of active devices.

Still another object of the present invention is to provide improved techniques for insulating field effect control elements.

Other objects and advantages reside in the construction of parts, the combination thereof, the method of manufacture and the mode of operation, as will become more apparent from the following description.

The thin film active device provided by the present invention is of the type identified as an insulated gate field effect device. In such device, spaced electrodes known as source and drain electrodes are placed in ohmic contact with a semiconductor body. By establishing a voltage difference between the source and drain electrodes an electric current is caused to flow through the semiconductor body between the source and drain electrodes. For modulating the electric current, a control electrode or gate is placed in proximity to the current path in the semiconductor body but insulated from the semiconductor body. An electrostatic potential impressed upon the control electrode can then be used to alter the current flow between the source and drain elements, without any appreciable current flowing between the control electrode and the semiconductor body.

Field effect devices of the foregoing type have two basic modes of operation, one being the enhancement mode and the other being the depletion mode. In the enhancement mode the semiconductor body has a deficiency of negative current carriers. Upon application of a positive voltage to the drain relative to the source element, only a slight current flow is realized. The current flow is substantially enhanced, however, by applying a positive voltage to the control electrode relative to the source so as to attract negative current carriers from the source. Modulation of the current flow is achieved by varying the voltage applied to the control element so as to assist or retard the injection of negative current carriers by the source electrode.

In depletion mode operation the semiconductor is of the type having an excess of negative current carriers so that conductivity between the source and drain elements occurs at comparatively low voltage differences therebetween. The control electrode is then biased negatively to reduce the current flow between the source and drain elements.

As will become more apparent in the following remarks the present invention is applicable to both the foregoing modes of operation, the enhancement mode being accomplished by the use of P-type semiconductors and the depletion mode being accomplished by the use of N-type semiconductors.

A preferred and well known technique for the production of thin film circuit elements employs light sensitive films known as photo-resists which, upon exposure to light of the proper wave length, undergo a chemical change so as to enable selective removal of the photo-resist film. The light exposure alters the solubility of the resist to solvent action so that selected areas of the resist film can be removed without disturbing other areas. The photo-resist technique is conveniently employed in the present invention. However, as those skilled in the art will recognize, the novel features of the present invention can be realized by other techniques.

Figures 1, 3, 5:
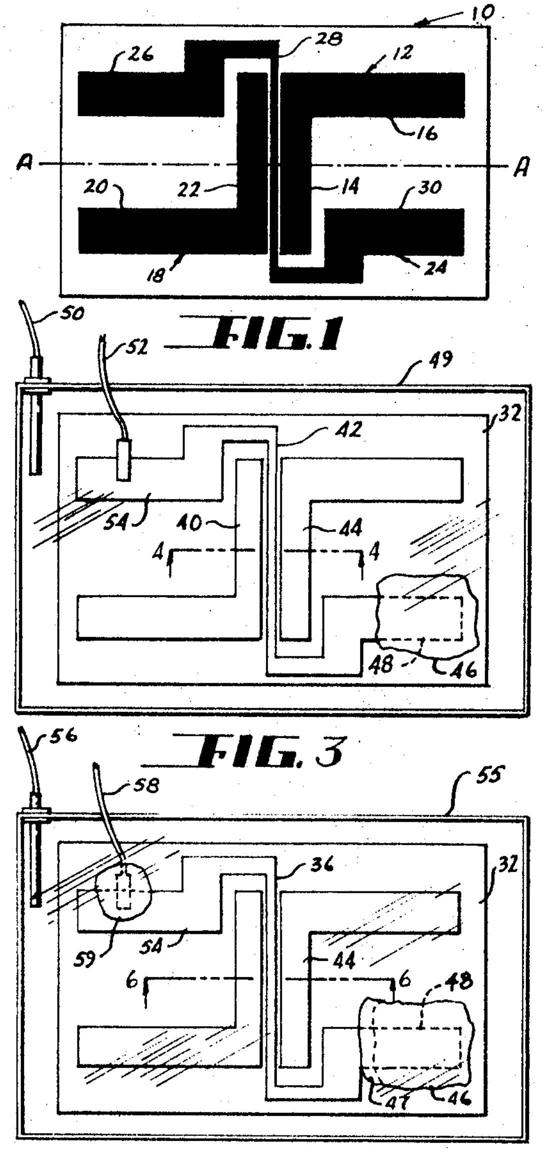
FIGURE 1 is a plan view of a photographic mask suitable for use in the practice of the present invention.
FIGURE 3 is a plan view schematically illustrating a deplating operation which may be employed in the practice of the present invention.
FIGURE 5 is a plan view schematically illustrating an anodizing operation which may be employed in the practice of the present invention.

For practising the present invention with the aid of photo-resist techniques, a photographic mask 10 such as illustrated in FIGURE 1 is produced. The mask 10 is a photographic film which has been blackened by exposure to light in selected areas. The blackened areas on the mask 10 can be identified by reference to the functional elements to be produced with the aid of the mask. Thus the mask includes an angular image area 12 having one leg 14 which locates one of the source or drain electrodes of the field effect device, and another leg 16 which locates a conductive lead for use in connecting the source or drain electrode to other circuit elements.

The mask also includes a second angular image area 18 having a first leg 22 to form the other of the source or drain electrodes of the field effect device and a second leg 20 to form a conductor to such other electrode.

The mask further includes a generally Z-shaped image area 24 having a central stem 28 to establish a control electrode or gate extending between the source and drain electrodes and areas 26 and 30 to provide conductive paths to the gate.

In one manner of constructing the subject field effect device, a layer of conductive material is applied to an insulating substrate such as glass. Tantalum is a preferred material for forming the conductive layer since it may be conveniently applied by sputtering in a partial vacuum and has good adhesion to glass. Tantalum also has other desirable properties to be more fully explained, however, the invention is not limited to the use of tantalum in the aforesaid conductive layer.

When tantalum is used, it is desirable to cover the tantalum with a noble metal such as gold to prevent undesirable oxidation of the tantalum when the vacuum is broken and also to provide good ohmic contact with semiconductor materials later applied thereto.

Following the deposition of tantalum, then gold, the vacuum is broken and a thin layer of a photo-resist applied over the gold surface. Using conventional optical techniques, the mask shown in FIGURE 1 is reduced to the size desired for the electrodes to be produced in the active device. Then the reduced mask is contacted with the photo-resist layer and exposed to actinic light. To illustrate the degree of reduction employed in the present invention, the FIGURE 1 illustration may be approximately actual size, whereas the dimensions of the reduced mask may be measured in microns, the length of the stem 28 being less than a millimeter.

By exposing all but the areas of the resist selected by the mask 10 to light which is actinic as to the resist, a chemical change in the resist is induced in the exposed areas of the resist. Using what is termed a positive resist, light exposure makes those areas exposed more vulnerable to solvent attack. Next, by treatment of the resist film with a solvent effective to dissolve the exposed areas of the resist, the exposed areas are removed, leaving the substrate 32 otherwise covered by the resist.

It will be understood that a negative photo-resist can also be used, this requiring only that the image mask be a negative instead of the positive shown in FIGURE 1.

After removal of the positive resist in the exposed areas, thereby uncovering the gold surface in such areas, the assembly is immersed in successive etching solutions effective first to remove the uncovered gold, then the tantalum exposed by gold removal. These steps, accomplished with conventional etching solutions, remove all gold and tantalum deposited on the substrate except in the areas shaded by the mask. Using a different solvent effective to remove the unexposed positive resist, all resist is now removed from the assembly.

In the foregoing etching steps, it is only important that the resist be not vulnerable to the gold etching solution. Thus, the gold not etched will protect the underlying tantalum from the tantalum etching solution and it is unimportant whether or not the tantalum etching solution attacks or penetrates the resist.

Figure 2:
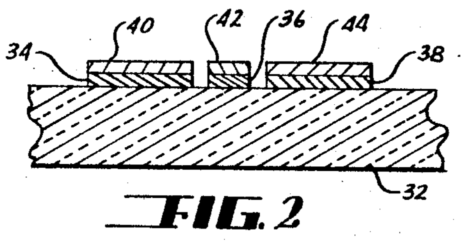
FIGURE 2 is a fragmentary section view taken through an intermediate assembly of the present invention produced with the aid of the mask of FIGURE 1, the section through the partial assembly being taken along a line through the assembly corresponding in location to the section line A—A shown on FIGURE 1.

The result of the foregoing steps is illustrated in FIGURE 2 which is a sectional view taken through the substrate 32 and through the deposited tantalum and gold layers along a line corresponding to the section line A—A of FIGURE 1. FIGURE 2 thus illustrates conductive thin film tantalum deposits 34, 36 and 38 contacting the glass substrate 32 in the shadow areas defined by the image areas 22, 28 and 14 of the mask 10. Overlying the deposits 34, 36 and 38 are protective gold deposits 40, 42 and 44.

The various deposits 34, 36, 38, 40, 42 and 44 illustrated in FIGURE 2 are grossly exaggerated. Thus the gold and tantalum films combined may be less than one micron thick, whereas the substrate 32 might be one-sixteenth of an inch thick.

While, for the purposes of illustrating at least one operative embodiment of the present invention, photo-resists and an appropriate mask are described for locating the electrode elements to be shielded from etching, it is to be understood that the present invention is not limited to these particular techniques. Thus, in lieu of the overall deposition of a metallic layer or layers later selectively etched, the substrate may first be given an overall coating of a resist and then selected areas of the resist removed to expose bare glass areas upon which the electrode elements are deposited.

A primary difficulty encountered in prior efforts to produce active devices using thin film techniques results from problems encountered in insulating the control electrode or gate from the semiconductor body. With the techniques of the present invention this difficulty is readily overcome in an exceedingly simple manner, the steps involved being selective removal of any protective layer applied to the control element or gate followed by selective treatment of the gate to produce an electrically insulating surface thereon.

When producing an active device using the previously discussed tantalum and gold layers, the selective treatment of the control element is readily accomplished by deplating the gold from only the control element and then selectively oxidizing the control element. Since oxidation of both conductive leads to the control element would preclude adequate electrical connection to the control element, it is necessary to prevent oxidation of at least one to the control element. For this purpose a photo-resist may be again applied to the substrate, exposed to light through a suitable mask, and then removed with the aid of a solvent in all but an area overlying at least one gate lead. FIGURE 3 illustrates the substrate 32 protected by a film of photo-resist 46 overlying only the conductive lead 48 to the control electrode. The mask used in this operation can be comparatively crude since it is only necessary to protect a part of the lead 48 without covering the control gate in the region between the source and drain electrodes.

With the assembly thus protected it is immersed in a suitable electrolyte for deplating gold, the electrolyte being confined in a tank or tray 49. An electrode 50 is contacted with the electrolyte and an electrode 52 contacted with the control gate lead 54. By connecting the electrode 50 to a source of negative potential and the electrode 52 to a source of positive potential, gold is then caused to deplate only from the control electrode and its conductive lead 54, the photo-resist film 46 preventing deplating of the gold from the area protected thereby. The deplating operation is continued until all gold has been removed from the control element thus exposing the tantalum layer 36 of the control element.

Representative electrolytes suitable for use in this gold deplating operation are dilute acid solutions, especially hydrochloric acid solutions.

Figure 4:
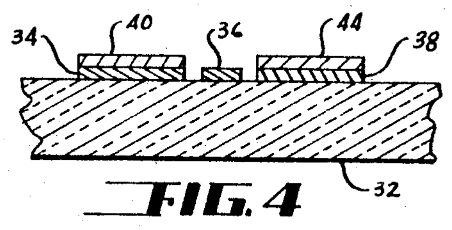
FIGURE 4 is a fragmentary section view taken substantially along the line 4—4 of FIGURE 3 after completion of the deplating operation.

FIGURE 4 illustrates the thin film assembly after deplating and in this figure it can be observed that only the gold film 42 overlying the tantalum film 36 has been removed.

In the next step of the present process, the exposed tantalum film 36 is treated to build a dielectric surface thereon. The treatment must be of such a nature that the gold surfaces 40 and 44 are not deleteriously affected insofar as their ability to make good ohmic contact with a semiconductor body is concerned. Various procedures having varying degrees of effectiveness have been developed for this purpose.

A simple and direct means to form the dielectric layer on the film 36 utilizes photo-resist materials. A thin layer of photo-resist is spread uniformly over the FIGURE 4 assembly and exposed through a suitable mask, not shown, so that all of the resist film can be removed except that overlying the film 36. All resist overlying the gold covered lead 54 is removed to expose a conductive lead to the film 36. The resist remaining on the film 36 provides an insulating barrier between the film 36 and a semiconductor body later applied thereto.

Such procedure has some disadvantages. Thus, accurate mask registration is needed to prevent an undesired overlap between the resist layer retained on the film 36 and the source and drain electrodes provided by the films 40 and 44. Since the gap width between the film 36 and the films 40 and 44 may be only one or two microns, or even less, mask registration at least to this degree of accuracy is required using the foregoing resist technique. The requirement for such extreme precision adds undesirably to the expense of the final product.

In addition, presently available resist materials have a relatively poor dielectric quality in comparison to the dielectric layers that can be produced with subsequently mentioned techniques and, accordingly, the use of presently known resists to provide the gate insulation forces a compromise in the quality of the final field effect device.

An insulating surface layer having superior qualities can be produced by exposing the assembly of FIGURE 4 to an oxidizing atmosphere preferably at an elevated temperature. This will promote the formation of an insulating tantalum oxide layer on the film 36 and, provided the temperature is limited to a level below that at which oxidation of gold might occur, does not deleteriously affect the surfaces 40 and 44. This procedure eliminates the need for mask registration previously mentioned. A conductive lead to the film 36 is preserved during oxidation of the tantalum film since the foregoing temperature limitation protects the gold pad overlying the lead 48 from oxidation. The gold pad here referred to is that preserved by the previously mentioned resist film 46 used during the gold deplating operation.

Practical difficulties encountered with this technique result from a lack of positive control over the thickness and continuity of the tantalum oxide layer thus produced and a lack of effective means to detect and correct imperfections in the dielectric layer.

A still more reliable technique for forming the insulating layer over the film 36 is afforded by means of a technique wherein the control element is insulated by anodization of the film 36.

For anodizing the control element, a positive electrode 58 is attached to the lead 54 and covered by a layer of resist 59 as shown in FIGURE 5. The resist layer 46 is also enlarged by a resist overlay 47 to positively seal the edges of the layer 46. The assembly is then immersed in an anodizing agent such as a conventional aqueous solution of oxalic acid and ethylene glycol and a negative tantalum electrode 56 contacted with the oxalic acid solution. This enables anodization of the control element and leads thereto in all areas except those protected by resist. The resist layer 59 prevents current leakage directly from the electrode 58 to the anodizing solution.

Figure 6:
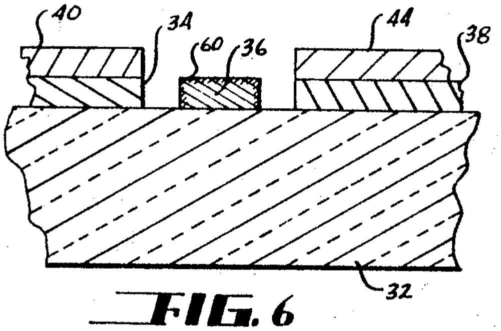
FIGURE 6 is a greatly enlarged fragmentary sectional view taken substantially along the line 6—6 of FIGURE 5 following the anodizing operation.

The result of the anodizing operation is illustrated in FIGURE 6 wherein a surface layer 60 comprising tantalum oxide is shown on the control element. The tantalum oxide in this layer includes tantalum derived from the film 36 and is chemically or molecularly linked to the film 36.

Anodization is particularly desirable for insulating the control electrode for the reason that the anodization progresses toward extinction of electrical conductivity and, accordingly, localized defects or pinholes in the areas exposed to the anodizing current are precluded except when impurities are present. Thus when the anodization process has extinguished itself by building up an insulating layer of tantalum oxide on the control element, it is not possible for localized conductive areas to remain for if such areas could exist they would be quickly removed by further anodization. The result then is an oxide insulated control element which by the very nature of the anodization process is insulated in all areas except those protected by the films 47 and 59. The degree of insulation can be made to approach perfection by the well known techniques of successive etching and anodization so as to cure or at least isolate localized imperfections present after the initial anodization step.

With anodization of the gate electrode and removal of the assembly from the anodizing solution, the protective resist films overlying the gate conductors 48 and 54 are no longer needed and are therefore removed by dissolution thereof with a proper solvent. At this point the assembly comprises gold covered source and drain electrodes with associated conductive leads and an anodized tantalum control electrode with an associated gold covered conductive lead.

The assembly is now in readiness for application of a semiconductor layer placed in contact with the source and drain electrodes and the oxide covered control electrode. The preferred method of accomplishing this application is by means of vacuum deposition of the semiconductor material. No particular masking or shielding is needed for this operation. Thus, it is not impractical, especially with P-type semiconductors, to deposit the semiconductor layer over the entire substrate 32, subsequently scraping the semiconductor material from the gold covered leads leading to the source, drain and gate elements to enable good ohmic contact. It is found convenient, however, to employ a shield for the conductive leads so as to eliminate the need for cleaning of these leads after vacuum deposition of the semiconductor. Such shield is also desirable when using N-type semiconductors so that interelectrode leakage is avoided.

Figure 7:
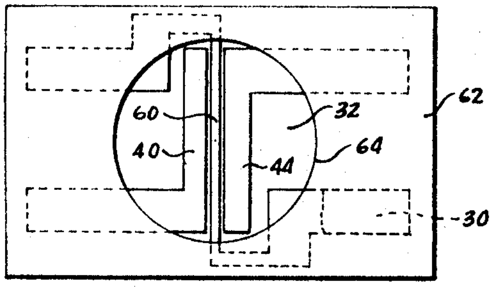
FIGURE 7 is a plan view illustrating a masking arrangement for use in application of a semiconductor layer to the partial assembly of FIGURE 6.

FIGURE 7 illustrates a suitable shield 62 placed in overlying relation to the substrate 32 and the electrodes assembled thereon. The shield 62 is provided with a central aperture 64 which, for convenience, may be circular. The aperture is large enough to expose the source, gate and drain electrodes in their entirety but not so large that the conductive leads to the electrodes are exposed. The semiconductor material is deposited through the aperture 64 and does not contact the leads proected by the shield 62.

Figure 8:
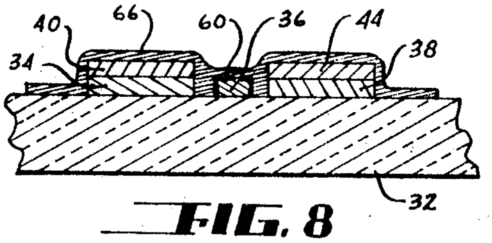
FIGURE 8 is a fragmentary section view illustrating one embodiment of the completed invention.

The resultant product after deposition of the semiconductor is illustrated in FIGURE 8. In this figure it will be observed that a path exists through the semiconductor material 66 between the source and drain elements and that this path necessarily crosses the insulated control electrode. As previously discussed, the potential difference applied to the source and drain electrodes produces a current flow between the source and drain elements which is modulated by means of an electrostatic potential applied to the gate element. Due to the presence of the anodized surface on the gate element there is no appreciable current flow between the gate element and the semiconductor material.

A growing number of compounds is available for use in the semiconductor layer. Representative compounds successfully employed in field effect devices of the type disclosed are copper sulfide, silver sulfide, lead peroxide, magnesium sulfide, cadmium sulfide, cadmium selenide, cadmium telluride, germanium and silicon.

The dimensions of the field effect device can be varied over a wide range, depending upon the operating characteristics desired. By way of illustration, the semiconductor layer may have a thickness in the order of one half micron and the source to drain gap may be in the order of twelve microns, with the gate electrode being approximately eight microns wide and being centered so as to provide approximate two micron gaps between the source and gate and between the gate and drain.

A gate insulation thickness of 0.1 micron is found adequate. This thickness is easily controlled in the anodization process, the thickness produced being approximately four thousandths of a micron per volt of anodizing potential. The thickness of the superimposed tantalum and gold layers may, as an example, be approximately one half micron of which the gold layers may comprise 0.1 micron.

It will be appreciated by those skilled in the art that the size, shape and arrangement of electrodes illustrated in the drawing is arbitrarily selected and other sizes, shapes and arrangements can be employed without departing from the scope of the present invention.

Those skilled in the art will also recognize that the present invention has a desirable feature in that it allows for the fabrication of spaced source and drain elements flanking a control gate element, all elements being disposed in coplanar relation on the supporting substrate. This construction is desirable in that it minimizes interelectrode capacitance.

In the foregoing description the present invention has been described with reference to the production of an isolated thin film active device upon an insulating substrate. It will be understood, however, that an isolated active device produced by thin film techniques is of little immediate utility due to the difficulty of completing lead connections. Thus, the principal value of thin film circuitry resides in the ease with which passive circuit elements, also in the form of thin film deposits, can be integrated with active elements on the same substrate. Although the description and drawings included in the present application relate to only an isolated active device, the active device will ordinarily be associated with additional circuit elements, not illustrated, which may comprise thin films deposited simultaneously with thin films used in the active device.

Although the preferred embodiment of the device has been described, it will be understood that within the purview of this invention various changes may be made in the combination thereof and mode of operation, which generally stated consist in a device capable of carrying out the objects set forth, as disclosed and defined in the appended claims.

Having thus described my invention, I claim:

1. An insulated gate field effect device comprising an insulating substrate having a planar surface, a plurality of conductive films disposed in spaced coplanar relation on said surface, one of said films having an electrolytically formed insulating layer thereon, the remaining of said films each comprising a first layer contacting said substrate and a second layer overlying said first layer, and a semiconductor body contacting said insulating layer of said one film, said second layers of said remaining films and said substrate.

2. The field effect device according to claim 1 wherein said spaced films comprise at least three and wherein said one film is disposed between two remaining films.

3. A field effect device according to claim 1 wherein said one film and the first layers of said remaining films comprise a first metal, said insulating layer comprises an anodically formed oxide of said first metal, and said second layers comprise a second metal having ohmic contact with said semiconductor body.

References Cited

UNITED STATES PATENTS

| | | | |
|---|---|---|---|
| 1,900,018 | 3/1933 | Lilienfeld | 317—235 |
| 3,191,061 | 6/1965 | Weimer | 317—235 X |
| 3,258,663 | 6/1966 | Weimer | 317—235 |
| 3,290,569 | 12/1966 | Weimer | 317—235 |
| 3,241,931 | 3/1966 | Triggs et al. | 29—195 |
| 3,273,027 | 9/1966 | Bourgault et al. | 317—231 X |

JOHN W. HUCKERT, *Primary Examiner.*

R. F. POLISSACK, *Assistant Examiner.*

U.S. Cl. X.R.

307—304; 317—231, 235; 330—38

PO-1050
(5/69)

UNITED STATES PATENT OFFICE
CERTIFICATE OF CORRECTION

Patent No. 3,445,732 Dated May 20, 1969

Inventor(s) John L. Janning

It is certified that error appears in the above-identified patent and that said Letters Patent are hereby corrected as shown below:

Column 4, line 44, the word "lead" was omitted at the beginning of the line. It should read ---lead to the control element. For this purpose a photo-resist may---.

SIGNED AND
SEALED
JAN 27 1970

(SEAL)
Attest:

Edward M. Fletcher, Jr.
Attesting Officer

WILLIAM E. SCHUYLER, JR.
Commissioner of Patents